United States Patent [19]

Brockway et al.

[11] Patent Number: 5,191,970

[45] Date of Patent: Mar. 9, 1993

[54] APPARATUS FOR EQUIPMENT UNIT PROTECTION SWITCHING

[75] Inventors: Robert C. Brockway, Salem; Philip S. Dietz, East Hampstead; Lo C. Nguyen, Windham, all of N.H.

[73] Assignee: AT&T Bell Laboratories, Murray Hill, N.J.

[21] Appl. No.: 767,304

[22] Filed: Sep. 27, 1991

[51] Int. Cl.[5] .......................... H01H 3/04; H01H 3/20
[52] U.S. Cl. ..................................... 200/335; 200/292; 200/318; 200/322; 340/687; 361/399
[58] Field of Search .............. 200/292, 318, 321, 322, 200/329, 335, 332, DIG. 6; 361/394, 395, 399, 412, 413, 415; 439/61, 62, 64; 211/41; 340/687; 324/158 R

[56] References Cited

U.S. PATENT DOCUMENTS

| | | | |
|---|---|---|---|
| 4,596,907 | 6/1986 | LaGreco et al. | 200/292 X |
| 4,614,389 | 9/1986 | Albert et al. | 339/45 |
| 4,914,550 | 4/1990 | Filsinger et al. | 361/415 X |
| 4,949,035 | 8/1990 | Palmer, II | 439/490 X |
| 4,952,758 | 8/1990 | Dara et al. | 200/51.09 |
| 4,967,312 | 10/1990 | Ozawa et al. | 361/395 X |
| 5,065,141 | 11/1991 | Whitsitt | 361/415 X |

*Primary Examiner*—Allan N. Shoap
*Assistant Examiner*—Jes F. Pascua
*Attorney, Agent, or Firm*—T. Stafford

[57] ABSTRACT

An equipment unit protection switch from an in-service equipment unit to a standby equipment unit is realized prior to any movement of the active equipment unit about to be removed from an equipment frame in which it is inserted. This is achieved by advantageously incorporating apparatus for generating an equipment unit removal indication signal that enables a controller to anticipate the removal of the equipment unit from the equipment frame. To this end, the equipment units employ an equipment unit latch and an associated switch to generate the equipment removal indication signal. Initial movement of the latch causes the equipment unit removal indication signal to be generated prior to any movement of the equipment unit in the frame in which it is inserted.

32 Claims, 4 Drawing Sheets

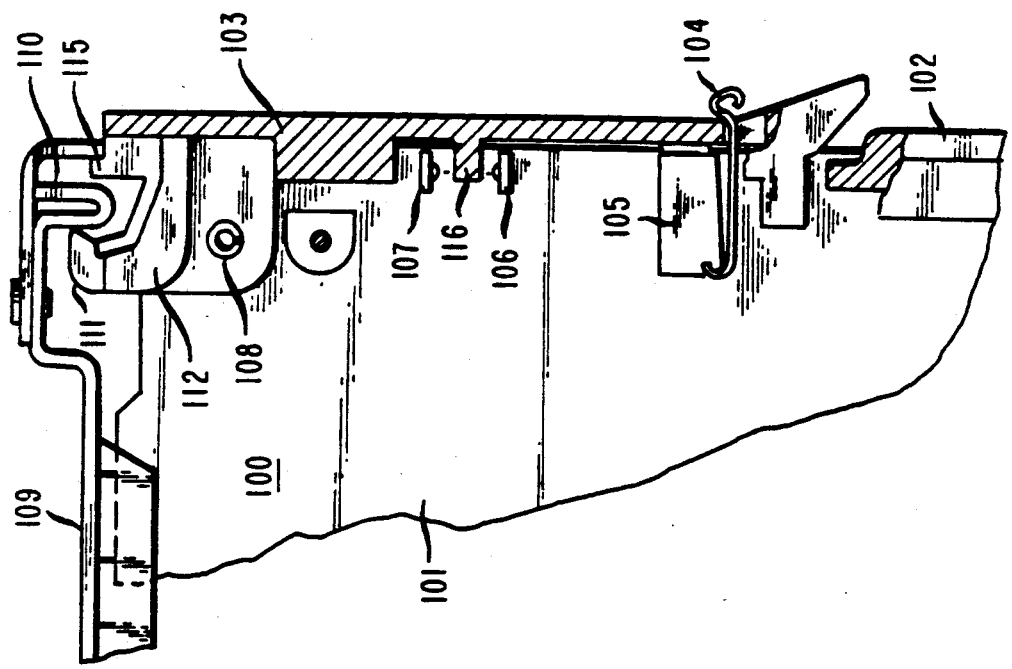
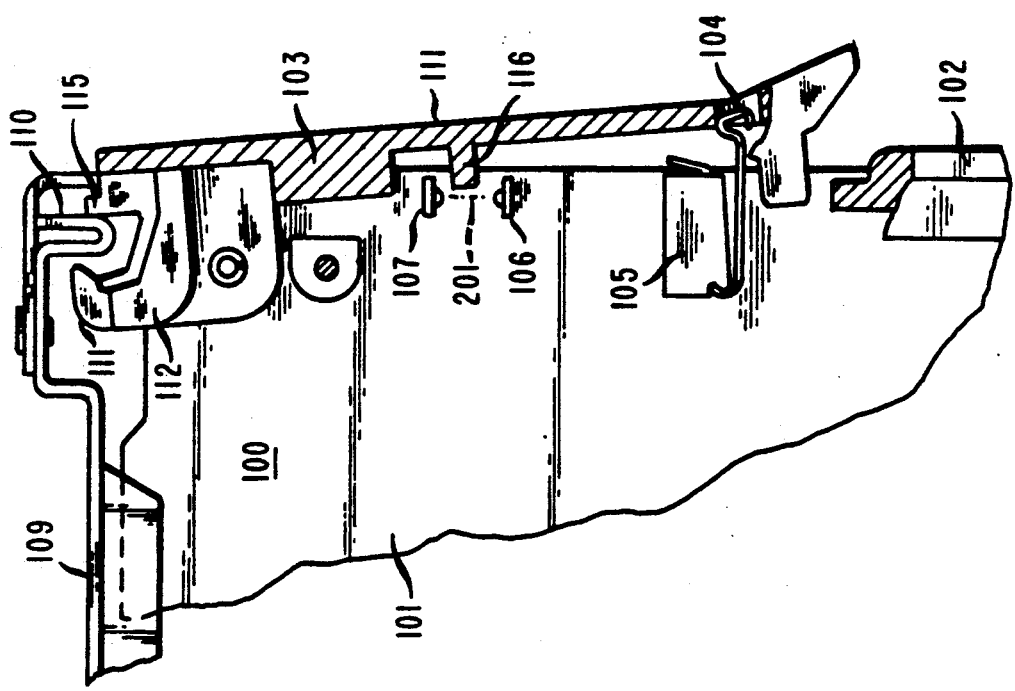

APPARATUS FOR EQUIPMENT UNIT PROTECTION SWITCHING

CROSS-REFERENCE TO RELATED APPLICATION

United States patent application Ser. No. 07/767,306 was filed concurrently herewith.

TECHNICAL FIELD

This invention relates to equipment unit protection switching and, more particularly, to minimizing disruption of customer service during an equipment unit protection switch.

BACKGROUND OF THE INVENTION

It has been the practice to employ redundant equipment units, e.g., plug-ins, circuit packs and the like, to enhance product reliability. The enhanced reliability has been realized by controllably switching service to a standby equipment unit upon detection of a failure of an in-service equipment unit or its removal from a connector in an equipment frame.

Prior known equipment unit protection switching arrangements that were specifically directed toward removal of equipment units, relied upon the complete disengagement of the equipment unit from its connector before initializing an equipment unit protection switch. Any movement of an equipment unit in its connector tends to cause transmission errors which have the potential for affecting customer service. This is especially true in relatively high digital bit rate transmission arrangements.

In such prior equipment unit protection switching arrangements, the time required to effect an equipment unit protection switch is directly dependent upon the speed at which the equipment unit is being removed from its connector. If the equipment unit was removed quickly, the protection switch would occur sooner than if it was removed slowly. In any event, the interval is still too long before completion of the equipment unit protection switch. Prior attempts at minimizing the time required to complete an equipment unit protection switch were primarily directed toward the use of complex fault detection and isolation algorithms. Such prior algorithms required a significant amount of processing time and processing resources.

SUMMARY OF THE INVENTION

These and other problems and limitations of prior known equipment unit protection switching arrangements are overcome, in accordance with the invention, by controllably anticipating the removal of an in-service equipment unit from its connector to initiate an equipment unit protection switch prior to any movement of the equipment unit in its connector.

In one embodiment of the invention, an equipment unit latch and associated switch arrangement is advantageously employed to provide an indication that the in-service equipment unit is about to be removed from its connector. Once the latch is moved in initiating removal of the equipment unit, the associated switch provides an equipment unit removal indication signal which is employed to initiate an equipment unit protection switch from the in-service equipment unit to the redundant standby equipment unit. Operation of the equipment unit protection switch algorithm is such that the protection switch is made to the redundant standby equipment unit before any movement of the in-service equipment unit has occurred toward disengaging it from its connector.

In a specific embodiment of the invention, a light sensor switching arrangement, for example, including an infrared emitter and associated detector, is employed as the associated switch.

A technical advantage of this invention is that an equipment unit protection switch is completed from the in-service equipment unit to the redundant equipment unit before any movement has occurred of the equipment unit being removed and, consequently, only out-of-service equipment units are actually removable.

BRIEF DESCRIPTION OF THE DRAWING

In the drawing:

FIG. 1 is a cut-away cross section view of an equipment unit inserted into an equipment frame;

FIG. 2 is another cut-away cross section view of an equipment unit about to be removed from an equipment frame;

DETAILED DESCRIPTION

Figure 3:
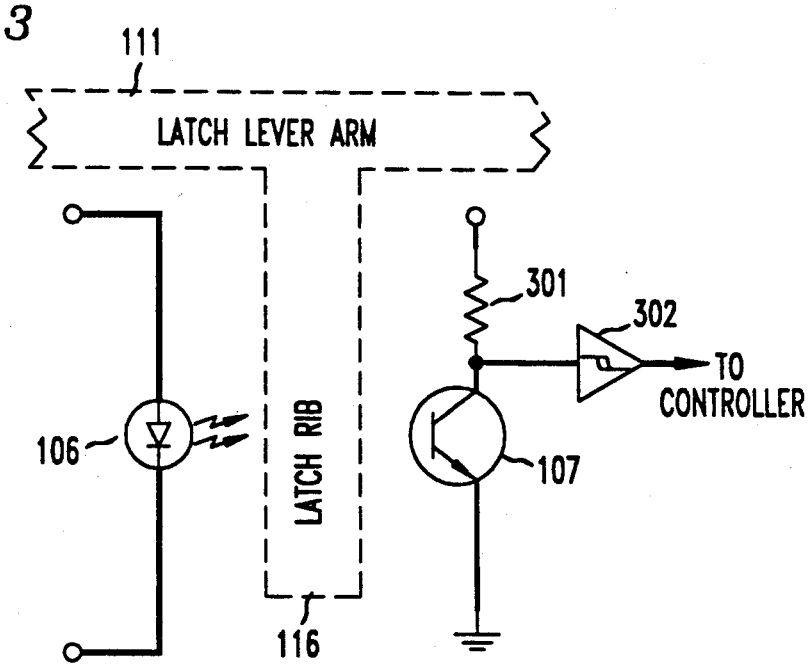
FIG. 3 shows, in simplified form, a portion of a face plate latch and a circuit diagram of the associated switch arrangement.

FIG. 1 shows a cut-away cross-section view of an equipment unit employing an equipment unit latch and an associated switch arrangement which may advantageously be employed in the invention. Shown is equipment unit 100 which, in this example, includes circuit board 101, face plate 102, latch 103, locking clip 104, alignment block 105, light emitter 106 and light detector 107. Additionally, circuit board 101 includes at one end a plurality of contacts (not shown) adapted to be inserted into a corresponding connector (not shown) supported by the equipment frame. Latch 103 is pivotally mounted to circuit board 101 at a pivot point via, for example, shoulder rivet 108. The portion of the equipment frame shown comprises upper shelf 109 including U-channel 110. Locking clip 104 is attached to alignment block 105 which, in turn, is mounted on circuit board 101. Locking clip 104 and alignment block 105 are arranged such as to affix latch 103 in place, i.e., in a closed position, when equipment unit 100 is fully inserted in the equipment frame. This is important to prevent inadvertent operation of the invention in generating an equipment unit removal indication signal. Such inadvertent operation of the invention could possibly be caused by vibration and the like.

Latch 103 includes a first lever arm 111 for application of rotational force which is typically applied by a person's hand or finger. A second lever arm 112 is shown as being hook shaped and includes so-called "cam-in" surface 114 and so-called "cam-out" surface 115. Cam-in surface 114 engages the rear surface of U-channel 110 when equipment unit 100 is being inserted into the equipment frame and cam-out surface 115 engages the front surface of U-channel 110 when equipment unit 100 is being extracted from the equipment frame. FIG. 1 shows the relative position of cam-in surface 114 and cam-out surface 115 when equipment unit 100 is fully inserted into the equipment frame. The spatial placement of U-channel 110 in shelf 109 and the dimensional spacing between surfaces 114 and 115 are important to the operation of latch 103 with the associated switch arrangement including light emitter 106 and light detector 107, in order to controllably anticipate the removal of an in-service equipment unit 100, in accordance with the invention.

Latch 103 also includes so-called latch rib 116 that is physically dimensioned and is arranged, in this example, such that light emitted from emitter 106 is blocked, i.e., inhibited, from being detected by detector 107 when equipment unit 100 is fully inserted in the equipment frame. That is, when latch 103 is in a closed position. It is important to note that detector 107 must be placed in such a position so that spurious light or light other than from emitter 106 cannot be detected. Detection of such spurious light could cause generation of an inadvertent erroneous equipment removal indication signal and is extremely undesirable. In this embodiment of the invention, an infrared emitter and detector arrangement are advantageously employed for emitter 106 and detector 107, respectively. Again, the dimensions of U-channel 110, latch arm 112, cam-in surface 114, cam-out surface 115 and latch rib 116 are such that generation of an equipment unit removal indication signal is inhibited when equipment unit 100 is fully inserted in the equipment frame. Note that the space between the inner surface of cam-out surface 114 and the front surface of U-channel 110 is such as to allow appropriate movement by lever arm 112 and, hence, latch rib 116 in order to allow light from emitter 106 to be detected by detector 107 prior to any movement of equipment unit 100 in the equipment frame, in accordance with an aspect of the invention.

FIG. 2 depicts a cut-away view of a portion of equipment unit 100 about to be removed from the equipment frame. Again, elements identical to those described above in relation to FIG. 1 are similarly numbered and are not described again in detail. FIG. 2 clearly illustrates that the dimensions of and placement of U-channel 110 in shelf 109 of the equipment frame and the dimensions of lever arm 112, including cam-in surface 114 and cam-out surface 115, are such as to allow sufficient movement of lever arm 111 and, hence, latch rib 116, in order to generate, in accordance with an aspect of the invention, an equipment unit removal indication signal prior to movement of equipment unit 100 in the equipment frame. In this example, the equipment unit removal indication signal is generated by detector 107 detecting light 201 emitted from emitter 106. Referring again to FIG. 1, the distance between the inner surface of cam-out surface 115 and the adjacent front surface of U-channel 110 is such as to allow the appropriate movement of latch lever arm 111 and, hence, latch rib 116, so that the equipment unit removal indication signal is generated prior to any movement of equipment unit 100 in the equipment frame.

FIG. 3 shows, in simplified form, details of a portion of the latch lever arm and a circuit diagram of the associated switch arrangement employed in this example to generate the equipment unit removal indication signal for effecting an equipment unit protection switch, in accordance with the invention. Specifically, shown are a portion of latch lever arm 111 including latch rib 116, light emitter 106 and light detector 107. Light emitter 106 is connected, in this example, when equipment unit 100 is fully inserted into the equipment frame and its connector, to a power source in such a manner as to emit light (infrared) continuously, in well known fashion. Detector 107 is also connected to a source of potential via resistor 301 and to a reference potential, e.g., ground potential. Thus, detector 107 is arranged so that when it detects light from emitter 106, a potential transition step, i.e., the equipment unit removal indication signal, is supplied as an output via buffer amplifier 302. Hysteresis is employed in the transfer function of buffer amplifier 302 to prevent so-called decision chatter when latch rib 116 moves through the cross-over point of detector 107. The equipment unit removal indication signal is supplied, for example, to a controller or the like to effect the desired equipment unit protection switch action. As indicated above, the equipment unit removal indication signal, is generated when latch lever arm 108 and, hence, latch rib 303 is initially moved a sufficient distance to enable the light to pass from emitter 301 to detector 302, in accordance with an aspect of the invention. As described below, the controller is responsive to the equipment unit removal indication signal to effect an appropriate protection switch algorithm for switching signals being transmitted from the requesting active, i.e., in-service, equipment unit to its associated standby equipment unit, in accordance with the invention.

Figure 4:
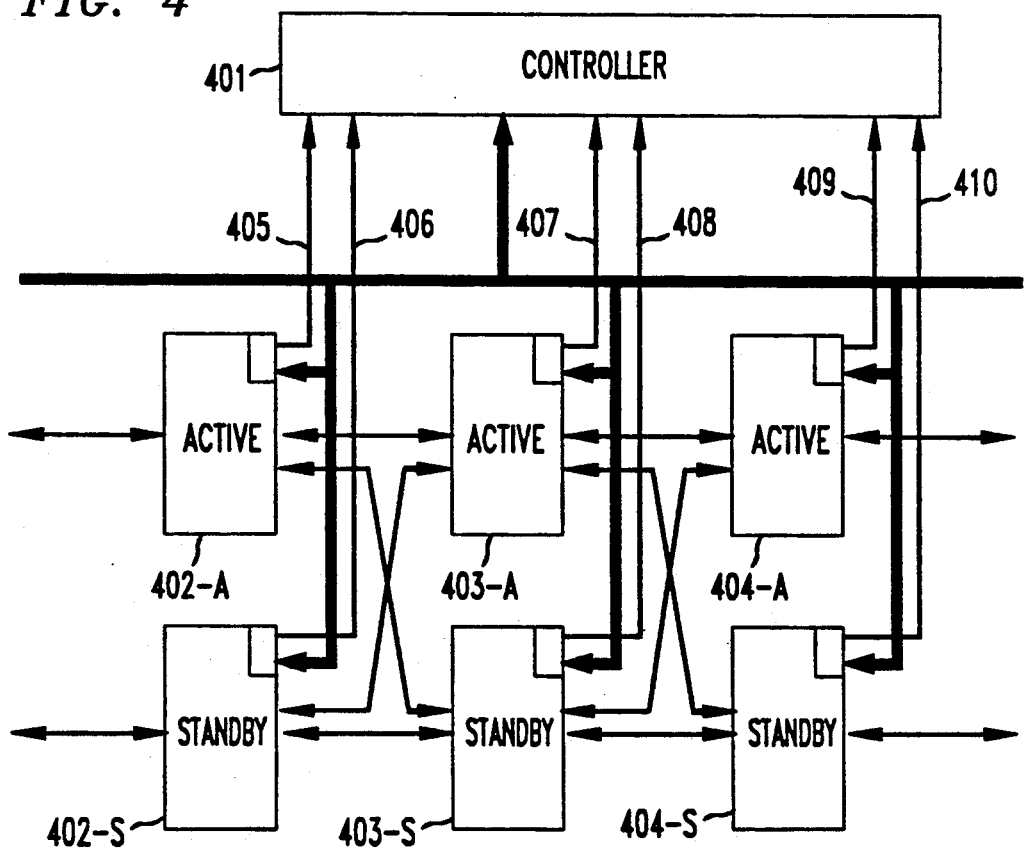
FIG. 4 depicts, in simplified form, a system arrangement employing the invention.

FIG. 4 shows, in simplified block form, an arrangement employing an embodiment of the invention. Shown are controller 401, active equipment units 402-A, 403-A and 404-A and corresponding standby equipment units 402-S, 403-S and 404-S. It is desirable to switch from an active, i.e., in-service, equipment unit to a standby equipment unit prior to removal of the active equipment unit and, by employing the invention, prior to any movement of the active equipment unit in an equipment frame. This is realized in the system of FIG. 4, in accordance with the invention, by each of equipment units 402-A, 403-A, 404-A, 402-S, 403-S and 404-S, including a latch and an associated switch arrangement. Upon any movement of the latch toward an attempted removal of the equipment unit, j the associated switch arrangement advantageously generates an equipment unit removal indication signal prior to any movement of the equipment unit from a corresponding equipment frame and, more particularly, from a connector therein. The equipment unit removal indication signal is supplied from each of equipment units 402-A, 403-A, 404-A, 402-S, 403-S and 404-S, via circuit paths 405 through 410, respectively, as appropriate to controller 401. In turn, controller 401 is connected via bus 405 to each of equipment units 402-A, 403-A, 404-A, 402-S, 403-S and 404-S. Bus 405 supplies signals to and receives signals from each of the equipment units indicating whether a switch is to be made and/or whether it is an active or a standby equipment unit. It should be noted that upon effecting an equipment unit protection switch, the appropriate standby unit is the "active" unit and the previously active unit is in a standby or out-of-service mode. Thus, upon receiving an equipment unit removal indication signal from an active equipment unit conroller 401 initiates an equipment protection switch algorithm which causes switching of the transmission of signals from the requesting in-service equipment unit to its corresponding standby equipment unit. For example, if active equipment unit 403-A supplies an equipment unit removal indication signal to controller 401, controller 401 would cause the signals being supplied to equipment unit 402-A and to equipment unit 404-A to be selected from equipment unit 403-S rather than equipment unit 403-A. The signals from equipment unit 403-A would appropriately be inhibited at equipment unit 402-A and equipment unit 404-A.

Figure 5:
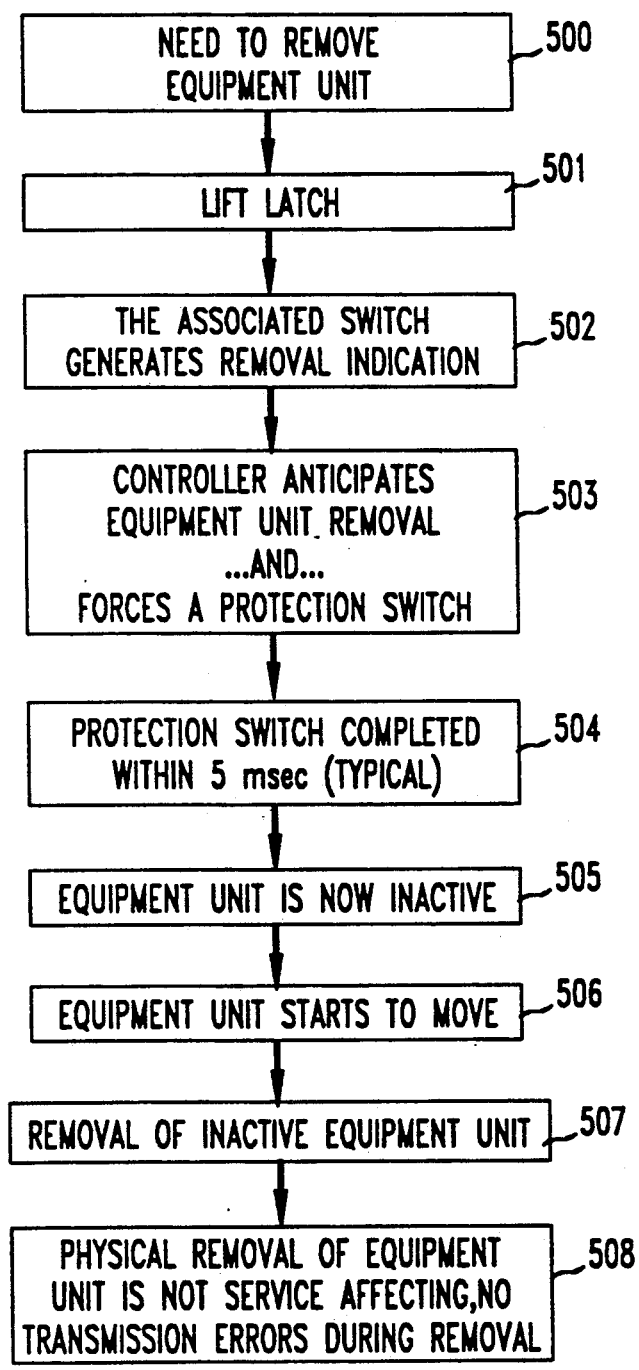
FIG. 5 is a flow chart illustrating steps taken utilizing the invention.

FIG. 5 is a flow chart showing steps in the operation of the invention. Specifically, step 500 indicates a need to remove an equipment unit. This removal is initiated by lifting the latch as indicated in step 501. Step 502 indicates that the associated switch arrangement, in this example, including light emitter 106 and light detector 107, generates the equipment unit removal indication signal. In response to reception of the equipment unit removal indication signal, the controller anticipates the removal of the corresponding equipment unit and forces an equipment unit protection switch to the appropriate standby equipment unit, as indicated in step 503. Step 504 indicates that the protection switch has been completed, usually in a relatively short interval. In this example, an equipment protection switch is typically effected in about five (5) msec. Step 505 indicates that the requesting equipment unit is now inactive. Step 506 indicates that the requesting equipment unit now first begins to move in the equipment frame and, hence, in any corresponding connector that it is inserted in. Step 507 indicates complete removal of the requesting equipment unit from the equipment frame. Step 508 then indicates that the physical removal of the equipment was not service-affecting and there were no transmission errors during the removal.

Figure 6:
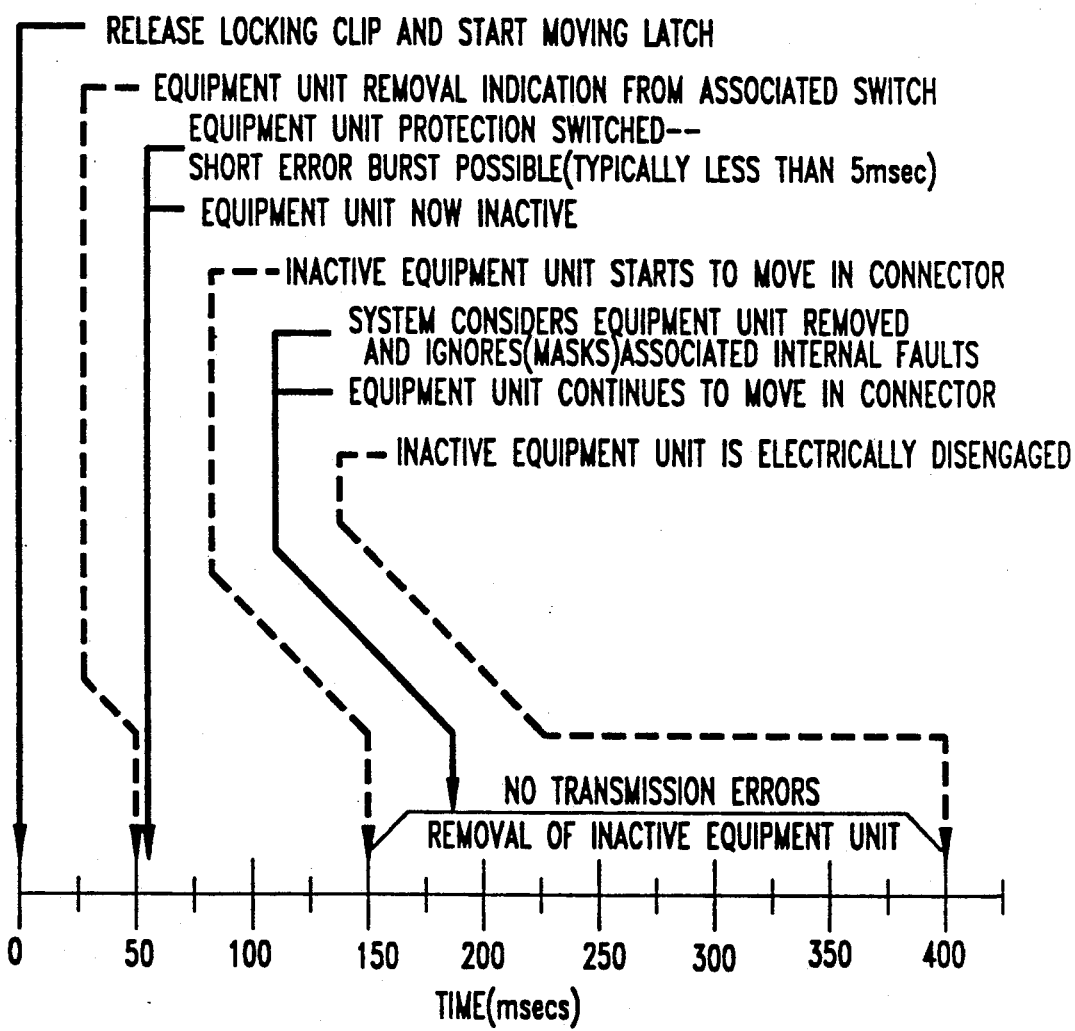
FIG. 6 graphically illustrates the time intervals at which the steps of FIG. 5 are effected.

FIG. 6 depicts a timing diagram illustrating the approximate time intervals at which the steps of FIG. 5 occur. Specifically, the initial movement of the latch occurs at time zero (0). The equipment unit removal indication signal is supplied to the controller at about the 50 msec point and an equipment unit protection switch is typically effected at about the 55 msec point. The previously in-service equipment unit requesting the switch is now also inactive. From this point on (time after about 55 msec), the controller considers that the requesting equipment unit has been removed and ignores any associated fault indications caused by the physical removal. Normally, the now inactive service unit begins to move in its connector at about the 150 msec point. The requesting equipment unit is electrically disengaged from its connector at about the 400 msec point. Thus, in this manner an equipment protection switch is made from a in-service active unit to an out-of-service standby unit without transmission errors possibly caused by movement of the in-service equipment unit is its connector. Again, this is realized by advantageously employing the invention to effect an equipment unit protection switch prior to any movement of the requesting equipment unit in the equipment frame end, hence, in its corresponding connector.

The above described arrangements are, of course, merely illustrative of the application of the principles of the invention. Other arrangements may be devised by those skilled in the art without departing from the spirit or scope of the invention. Although a central controller is employed in the disclosed embodiment, it will be apparent that individual controllers in the equipment units could be equally employed. Moreover, it will be apparent that other positions of light sensor arrangements may be employed. For example, an integral light emitter-detector arrangement could be used in which light from the emitter is normally reflected off a surface either on the latch assembly or the circuit board and supplied to the detector. Then, an equipment unit removal indication signal would be generated by movement of the latch assembly causing the light from the emitter not to be supplied to the detector. Additionally, in other applications, a mechanical switch, magnetic switch, Hall effect switch or the like, could equally be enabled and disabled by movement of the latch assembly. It will also be apparent that the switch arrangements could be placed at other locations on the circuit board or equipment frame to realize the generation of the desired equipment unit removal indication signal. Again, it is important to note in either of these additional examples, the generation of the equipment unit removal indication signal must occur at an appropriate instant after movement of the latch assembly, but prior to any movement of the equipment unit in the equipment frame, in accordance with an aspect of the invention.

We claim:

1. Apparatus for effecting an equipment unit protection switch from an equipment unit being removed from an equipment frame in which it is intended to be inserted to a standby equipment unit, the equipment unit including a circuit board intended to be inserted in a connector in the equipment frame and a latch pivotally mounted on said circuit board for securing the equipment unit in the equipment frame, the apparatus being CHARACTERIZED BY, said latch being physically dimensioned to allow prescribed initial movement thereof from a closed position before any movement of the circuit board in its connector in the equipment frame when attempting to remove said equipment unit from the equipment frame, means associated with said latch and being responsive to said initial movement of said latch for generating an equipment unit removal indication signal for initiating the equipment unit protection switch prior to any movement of said circuit board in its connector, and means responsive to said equipment unit removal indication signal for effecting the protection.

2. Apparatus as defined in claim 1 wherein said latch is arranged to disable said generating means from generating said equipment unit removal indication signal when the equipment unit is fully inserted in the equipment frame and said latch is in a closed position.

3. Apparatus as defined in claim 2 wherein said means for generating comprises switch means.

4. Apparatus as defined in claim 3 wherein said switch means includes light responsive switch means.

5. Apparatus as defined in claim 4 wherein said light responsive switch means includes a light emitter and a light detector.

6. Apparatus as defined in claim 5 wherein said light emitter comprises an infrared light emitter and said light detector comprises an infrared light detector.

7. Apparatus as defined in claim 5 wherein said means for generating further includes amplifier means in circuit with said light detector for supplying said equipment unit removal indication signal as an output, said amplifier means having a transfer function employing hysteresis.

8. Apparatus as defined in claim 2 wherein said latch includes a first lever arm for application of a force for causing rotational movement of said latch about said pivot point and a second lever arm having a surface adapted to engage a prescribed portion of the equipment frame when force is applied to said first lever arm toward removing the equipment unit from the equipment frame, said surface arranged to engage a prescribed portion of the equipment frame is adapted to be physically positioned relative to said prescribed portion of the equipment frame when the equipment unit is fully inserted in the equipment frame such as to allow sufficient movement of said latch from said closed position so that equipment unit removal indication signal is generated prior to said surface engaging said prescribed portion of the equipment frame upon movement of the latch toward removal of said equipment unit from the equipment frame, but prior to any movement of the circuit board contact section in the connector in the equipment frame.

9. Apparatus as defined in claim 8 wherein said first lever arm is arranged to inhibit generation of said action initiation signal when said latch is in the closed position.

10. Apparatus as defined in claim 9 wherein said means for generating comprises switch means.

11. Apparatus as defined in claim 10 wherein said switch means includes light responsive switch means.

12. Apparatus as defined in claim 11 wherein said light responsive switch means includes a light emitter and a light detector.

13. Apparatus as defined in claim 12 wherein said means for generating further includes amplifier means in circuit with said light detector for supplying said equipment unit removal indication signal as an output, said amplifier means having a transfer function employing hysteresis.

14. Apparatus as defined in claim 12 wherein said light emitter comprises an infrared light emitter and said light detector comprises an infrared light detector.

15. Apparatus as defined in claim 12 wherein said light emitter and said light detector are mounted on the circuit board in prescribed spatial relationship to each other and to said first lever arm of said latch and wherein said first lever arm of said latch includes an element arranged to inhibit light being emitted from said light emitter reaching said light detector when the equipment unit is fully inserted in the equipment frame and the latch is in a closed position and such that said light detector is able to detect light from said light emitter upon the first lever arm of said latch moving a prescribed distance upon initiation of removal of the equipment unit from the equipment frame, but prior to any movement of the equipment unit in the equipment frame.

16. Apparatus as defined in claim 15 wherein said element of said first lever arm comprises a protruding element having prescribed dimensions and being physically arranged to physically inhibit light emitted by said emitter from reaching said light detector when the equipment unit is fully inserted in the equipment frame and the latch is in a closed position and such that said light detector is enabled to detect light from said light emitter upon the protruding element of the first lever arm of said latch moving a prescribed distance upon initiation of removal of the equipment unit from the equipment frame, but prior to any movement of the equipment unit in the equipment frame.

17. A system for effecting an equipment unit protection switch including at least a first equipment unit intended to be an active equipment unit and at least a second equipment unit intended to be a standby equipment unit, each of said equipment units intended to be inserted in an equipment frame, and each of said equipment units including a circuit board intended to be inserted in a connector in the equipment frame and a latch pivotally mounted on said circuit board for securing the equipment unit in the equipment frame, the system being CHARACTERIZED BY, said latch in each of said equipment units being physically dimensioned to allow prescribed initial movement thereof from a closed position before any movement of the corresponding circuit board in its connector in the equipment frame when attempting to remove the corresponding equipment unit from the equipment frame, means in each of said equipment units associated with said latch and being responsive to initial movement of said latch for generating an equipment unit removal indication signal for initiating the equipment unit protection switch prior to any movement of said circuit board in the corresponding equipment unit in its connector, and means responsive to said equipment unit removal indication signal for effecting a protection switch from the active equipment unit being removed to said standby equipment unit.

18. A system as defined in claim 17 wherein said latch in each of said equipment units is arranged to disable said generating means from generating said equipment unit removal indication signal when the corresponding equipment unit is fully inserted in the equipment frame and said latch is in a closed position.

19. A system as defined in claim 18 wherein said means for generating comprises switch means.

20. A system as defined in claim 19 wherein said switch means includes light responsive switch means.

21. A system as defined in claim 20 wherein said light responsive switch means includes a light emitter and a light detector.

22. Apparatus as defined in claim 21 wherein said means for generating further includes amplifier means in circuit with said light detector for supplying said equipment unit removal indication signal as an output, said amplifier means having a transfer function employing hysteresis.

23. A system as defined in claim 21 wherein said light emitter comprises an infrared light emitter and said light detector comprises an infrared light detector.

24. A system as defined in claim 18 wherein said latch in each of said equipment units includes a first lever arm for application of a force for causing rotational movement of said latch about said pivot point and a second lever arm having a surface adapted to engage a prescribed portion of the equipment frame when force is applied to said first lever arm toward removing the corresponding equipment unit from the equipment frame, said surface arranged to engage a prescribed portion of the equipment frame is adapted to be physically positioned relative to said prescribed portion of the equipment frame when the corresponding equipment unit is fully inserted in the equipment frame such as to allow sufficient movement of said latch from said closed position so that equipment unit removal indication signal is generated prior to said surface engaging said prescribed portion of the equipment frame upon movement of the latch toward removal of said corresponding equipment unit from the equipment frame, but prior to any movement of the circuit board contact section of the corresponding equipment unit in the connector in the equipment frame.

25. A system as defined in claim 24 wherein said first lever arm is arranged to inhibit generation of said action initiation signal when said latch is in the closed position.

26. A system as defined in claim 25 wherein said means for generating comprises switch means.

27. A system as defined in claim 26 wherein said switch means includes light responsive switch means.

28. A system as defined in claim 27 wherein said light responsive switch means includes a light emitter and a light detector.

29. Apparatus as defined in claim 28 wherein said means for generating further includes amplifier means in circuit with said light detector for supplying said equipment unit removal indication signal as an output, said amplifier means having a transfer function employing hysteresis.

30. A system as defined in claim 28 wherein said light emitter comprises an infrared light emitter and said light detector comprises an infrared light detector.

31. A system as defined in claim 28 wherein said light emitter and said light detector are mounted on the circuit board of a corresponding one of said equipment units in prescribed spatial relationship to each other and to said first lever arm of said latch and wherein said first lever arm of said latch includes an element arranged to inhibit light being emitted from said light emitter reaching said light detector when the corresponding equipment unit is fully inserted in the equipment frame and the latch is in a closed position and such that said light detector is able to detect light from said light emitter upon the first lever arm of said latch moving a prescribed distance upon initiation of removal of the corresponding equipment unit from the equipment frame, but prior to any movement of the corresponding equipment unit in the equipment frame.

32. A system as defined in claim 31 wherein said element of said first lever arm comprises a protruding element having prescribed dimensions and being physically arranged to physically inhibit light emitted by said emitter from reaching said light detector when the corresponding equipment unit is fully inserted in the equipment frame and the latch is in a closed position and such that said light detector is enabled to detect light from said light emitter upon the protruding element of the first lever arm of said latch moving a prescribed distance upon initiation of removal of the equipment unit from the equipment frame, but prior to any movement of the equipment unit in the equipment frame.

* * * * *